(12) United States Patent
Lee

(10) Patent No.: US 9,461,057 B2
(45) Date of Patent: Oct. 4, 2016

(54) SEMICONDUCTOR DEVICE AND MANUFACTURING METHOD OF THE SAME

(71) Applicant: SK hynix Inc., Icheon-si Gyeonggi-do (KR)

(72) Inventor: Young Jin Lee, Yongin-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/699,611

(22) Filed: Apr. 29, 2015

(65) Prior Publication Data

US 2016/0148941 A1 May 26, 2016

(30) Foreign Application Priority Data

Nov. 24, 2014 (KR) .................. 10-2014-0164341

(51) Int. Cl.
*H01L 27/115* (2006.01)
*H01L 21/768* (2006.01)

(52) U.S. Cl.
CPC ....... *H01L 27/115* (2013.01); *H01L 21/76802* (2013.01); *H01L 21/76843* (2013.01); *H01L 21/76871* (2013.01); *H01L 21/76877* (2013.01)

(58) Field of Classification Search
CPC ............... H01L 27/11578; H01L 27/1157; H01L 27/115; H01L 29/4958; H01L 29/0657
USPC ............... 257/324, 329, 499, 508; 438/404
See application file for complete search history.

(56) References Cited

U.S. PATENT DOCUMENTS

| | | | | |
|---|---|---|---|---|
| 2014/0070300 A1* | 3/2014 | Jang | ............ | H01L 27/11565 257/324 |
| 2014/0264549 A1* | 9/2014 | Lee | ............ | H01L 27/11582 257/324 |

FOREIGN PATENT DOCUMENTS

| KR | 10-0604805 B1 | 7/2006 |
|---|---|---|
| KR | 1020140079915 A | 6/2014 |

* cited by examiner

*Primary Examiner* — Thomas L Dickey
*Assistant Examiner* — Changhyun Yi
(74) *Attorney, Agent, or Firm* — William Park & Associates Ltd.

(57) ABSTRACT

A semiconductor device may include semiconductor patterns. The semiconductor device may include insulating layers including first regions surrounding the semiconductor patterns and second regions isolated from each other by island-type first openings and connecting the first regions adjacent to each other. The semiconductor device may include metal layers interposed between the first regions of the stacked insulating layers surrounding the semiconductor patterns, and isolated from each other by line-type second openings overlapping the first openings and the second regions. The semiconductor device may include dielectric patterns partially interposed between the insulating layers and the metal layers and exposed through the second openings.

9 Claims, 10 Drawing Sheets

SEMICONDUCTOR DEVICE AND MANUFACTURING METHOD OF THE SAME

CROSS-REFERENCE TO RELATED APPLICATION

The present application claims priority to Korean patent application number 10-2014-0164341 filed on Nov. 24, 2014, in the Korean Intellectual Property Office, the entire disclosure of which is incorporated by reference herein.

BACKGROUND

1. Technical Field

Various embodiments generally relate to an electronic device and a method of manufacturing the same. More particularly, the various embodiments relate to a semiconductor device having a three-dimensional structure, and a method of manufacturing the same.

2. Related Art

Nonvolatile memory devices are memory devices capable of maintaining data stored therein even when its' power supply has been interrupted. Recently, the two-dimensional nonvolatile memory devices have been reaching their physical limits because the memory cells of the two-dimensional nonvolatile memory devices are formed in a single layer on a silicon substrate. Thus, three-dimensional nonvolatile memory devices including a plurality of memory cells vertically stacked on a silicon substrate have been proposed.

In order to stack a plurality of memory cells, the three-dimensional nonvolatile memory devices have a structure including conductive layers and insulating layers that are alternately stacked. In addition, for efficiency in the manufacturing processes, after sacrificial layers and the insulating layers are alternately stacked, the conductive layers may replace the stacked sacrificial layers. However, during a process of replacing the sacrificial layers with the conductive layers, the remaining insulating layers may be inclined or collapsed and result in lowering a yield and characteristics of the memory device.

BRIEF SUMMARY

In an embodiment, semiconductor device may include semiconductor patterns. The semiconductor device may include insulating layers including first regions surrounding the semiconductor patterns and second regions isolated from each other by island-type first openings and connecting the first regions adjacent to each other. The semiconductor device may include metal layers interposed between the first regions of the stacked insulating layers surrounding the semiconductor patterns, and isolated from each other by line-type second openings overlapping the first openings and the second regions. The semiconductor device may include dielectric patterns partially interposed between the insulating layers and the metal layers and exposed through the second openings.

In an embodiment, a method of manufacturing a semiconductor device may include alternately forming sacrificial layers and insulating layers, forming first openings passing through the sacrificial layers and the insulating layers, and forming second openings by removing the sacrificial layers exposed through the first openings. The method of manufacturing the semiconductor device may include forming barrier layers on the insulating layers exposed through the first and second openings, forming deposition-preventing layers on the barrier layers exposed through the first openings, and depositing metal layers on the barrier layers exposed by the deposition-preventing layers.

In an embodiment, a method of manufacturing a semiconductor device may include alternately forming sacrificial layers and insulating layers, forming first openings passing through the sacrificial layers and the insulating layers, and forming second openings by removing the sacrificial layers exposed through the first openings. The method of manufacturing the semiconductor device may include forming seed layers on the insulating layers exposed through the first and second openings, forming growth-preventing layers on the seed layers exposed through the first openings, and growing metal layers from the seed layers exposed by the growth-preventing layers.

BRIEF DESCRIPTION OF THE DRAWINGS

FIGS. 2, 3, 4A to 7A, and 4B to 7B are diagrams illustrating a representation of an example of a method of manufacturing a semiconductor device according to an embodiment.

DETAILED DESCRIPTION

Figure 1A:
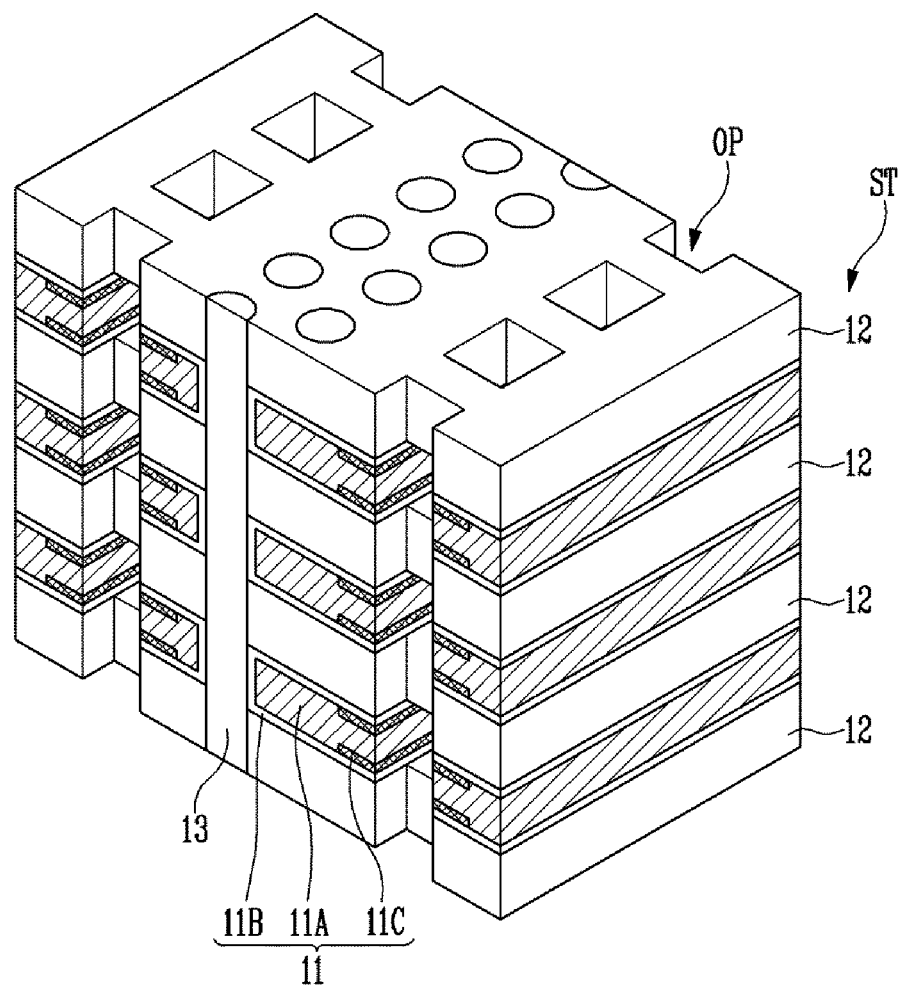
FIG. 1A is a perspective view illustrating a representation of an example of a structure of a semiconductor device according to an embodiment.

Various embodiments will be described hereinafter with reference to the accompanying drawings, in which various examples of the embodiments are illustrated. The embodiments may be embodied in different forms and should not be construed as limited to the embodiments set forth herein. In the drawings, the widths, lengths, and thicknesses of constituent elements may be exaggerated for clarity and convenience of illustration. Constituent elements other than elements constituting essential features of the embodiments may be omitted from the drawings, for clarity of description. Like reference numerals and letters refer to like elements throughout.

Various embodiments may be directed to a semiconductor device having a high production yield and a stable structure, and a method of manufacturing the same.

FIG. 1A is a perspective view illustrating a representation of an example of a structure of a semiconductor device according to an embodiment. Referring to FIG. 1A, the semiconductor device according to an embodiment may include a stacked structure ST including conductive layers 11 and insulating layers 12 are alternately stacked, and semiconductor patterns 13.

The semiconductor patterns 13 may be formed to pass through the stacked structure ST and may be arranged in a matrix form or a staggered form such that centers of the semiconductor patterns 13 are staggered with respect to each other. For example, the semiconductor patterns 13 may include silicon (Si), and may comprise channel layers of memory cells, a select transistor, or the like. Although not illustrated in the drawings, center areas of the semiconductor patterns 13 may be open, and gap-fill insulating layers may fill the opened center areas.

Openings OP may be disposed between the semiconductor patterns 13, and pass through the stacked structure ST. The openings OP may have an island shape at a height corresponding to the insulating layers 12 and a line shape at a height corresponding to the conductive layers 11. This will be described later with respect to FIGS. 1B and 1C.

The insulating layers 12 may surround the semiconductor patterns 13 and may be stacked with predetermined intervals. For example, the insulating layers 12 may include an oxide, a nitride, or the like.

The conductive layers 11 may be stacked to surround the semiconductor patterns 13, and may be interposed between the stacked insulating layers 12. Each of the conductive layers 11 may include a metal layer 11A, a barrier pattern 11B, and a dielectric pattern 11C, or a metal layer 11A, a seed pattern 11B, and a dielectric pattern 11C.

The metal layers 11A may be interposed between the stacked insulating layers 12, and may include tungsten (W), tungsten nitride (WNx), or the like. The metal layers 11A may have different widths according to locations. For example, the metal layers 11A may have a smaller width at an area located adjacent to the openings OP than at an area located adjacent to the semiconductor patterns 13.

The barrier patterns 11B may be interposed between the semiconductor patterns 13 and the metal layers 11A, between the metal layers 11A and the insulating layers 12, and between the dielectric patterns 11C and the insulating layers 12. The barrier patterns 11B may have a C shape surrounding the metal layers 11A. For example, the barrier patterns 11B may include tantalum (Ta), titanium (Ti), tantalum nitride (TaN), titanium nitride (TiN), etc.

For reference, the barrier patterns 11B may be substituted by the seed patterns. The seed patterns may serve nucleation for growing the metal layers 11A and include W or the like. Since the seed patterns have the same shape as the barrier patterns 11B, a separate figure is not provided.

The dielectric patterns 11C may be deposition-preventing patterns, which partially cover the barrier patterns 11B to control areas on which the metal layers 11A are deposited. In this example, the dielectric patterns 11C may be formed of a material having a larger bonding energy than the barrier patterns 11B. Adhesive strengths between the barrier patterns 11B and the metal layers 11A may be greater than those between the dielectric patterns 11C and the metal layers 11A. The metal layers 11A may not be deposited on the dielectric patterns 11C.

The dielectric patterns 11C may be growth-preventing patterns, which partially cover the seed patterns to control areas on which metal layers are grown. The dielectric patterns 11C may be interposed between the insulating layers 12 and the metal layers 11A in areas adjacent to the openings OP and, more particularly, between the barrier patterns 11B and the metal layers 11A. The metal layers 11A may not be grown on portions (of the seed patterns) covered by the dielectric patterns 11C, and may be grown on portions (of the seed patterns) not covered by the dielectric patterns 11C. For example, the dielectric patterns 11C may include an oxide, a nitride, a hydrogen-bonded material, or the like.

Figure 1B:
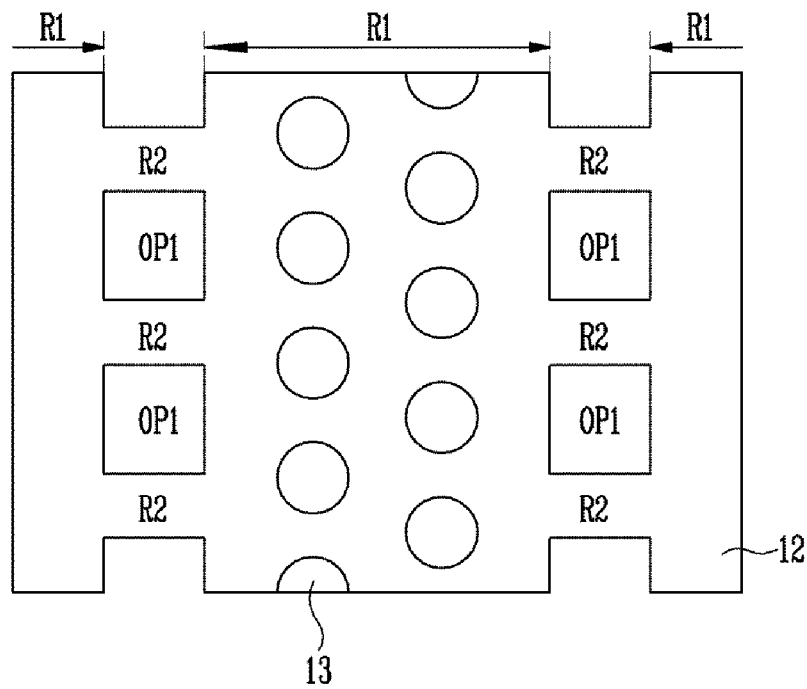
FIG. 1B is a representation of an example of an illustration of a layout of an insulating layer according to an embodiment.

FIG. 1B is a representation of an example of an illustration of a layout of an insulating layer 12 according to an embodiment. Referring to FIG. 1B, the insulating layer 12 may include first regions R1 surrounding semiconductor patterns 13, and bridge-type second regions R2.

A first region R1 of the insulating layer 12 may be a portion surrounding a row configured with at least two semiconductor patterns 13. A second region R2 of the insulating layer 12 may be a bridge-type pattern connecting the first regions R1 located at both ends of the second region R2. The second regions R2 may be isolated from each other by island-type first openings OP1. For example, the first openings OP1 may be arranged in a predetermined interval, and have a variety of cross-sectional shapes, such as a circular, oval, tetragonal, or polygonal shape.

Figure 1C:
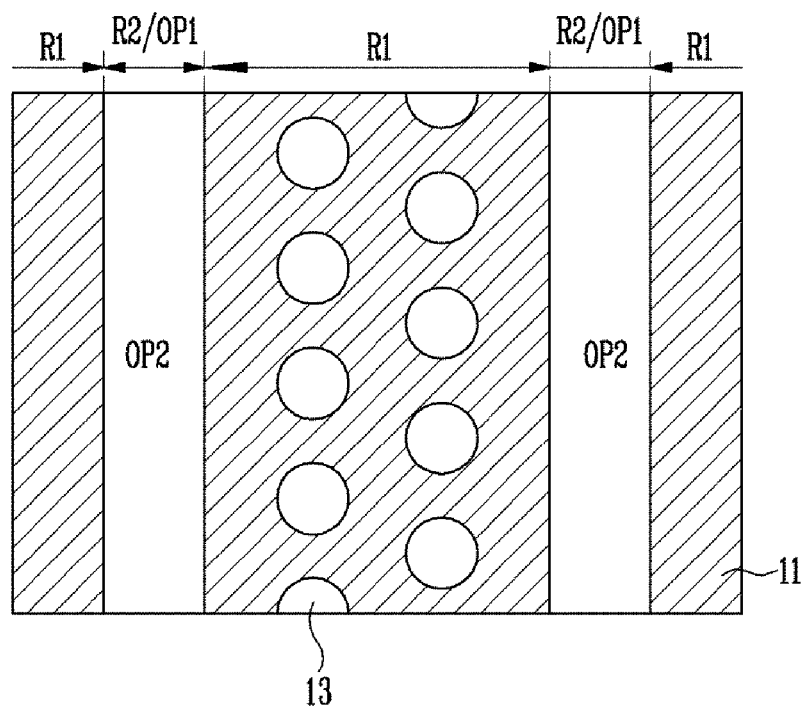
FIG. 1C is a representation of an example of an illustration of a layout of a conductive layer according to an embodiment.

FIG. 1C is a representation of an example of an illustration of a layout of conductive layers 11 according to an embodiment. Referring to FIG. 1C, the conductive layers 11 may be isolated from each other by second openings OP2. Each conductive layer 11 may be interposed between the first regions R1 of the stacked insulating layers 12. The second openings OP2 may be disposed to overlap the second regions R2 and first openings OP1 of the insulating layers 12. The second openings OP2 may have a line shape.

Figure 2:
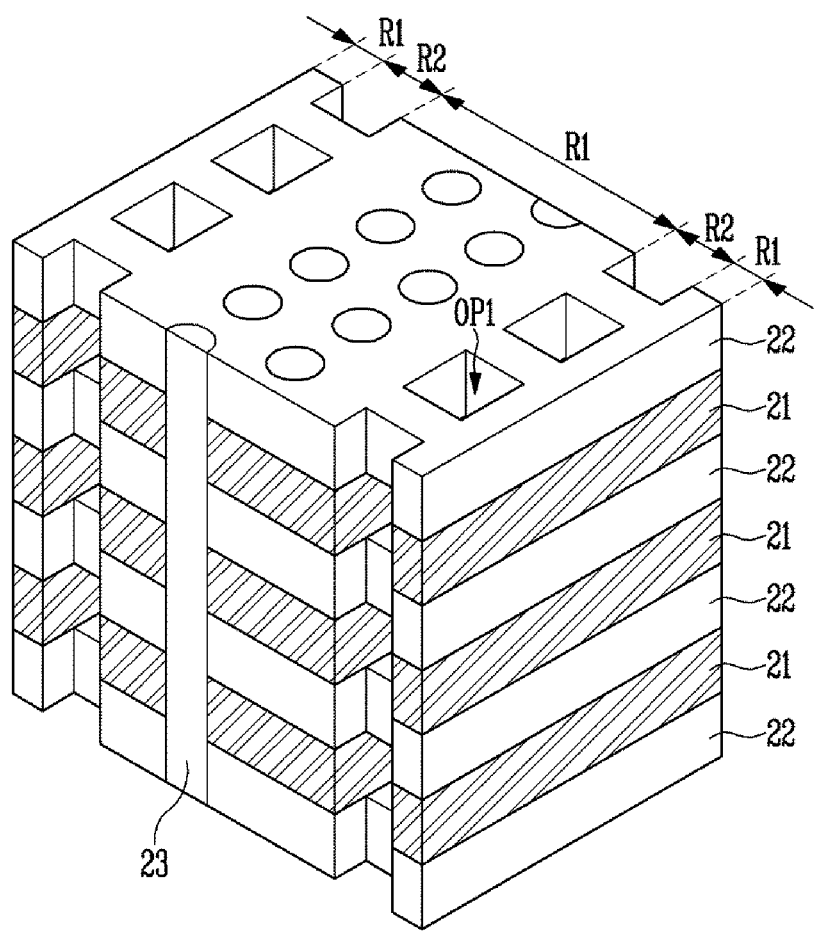
Figure 3:
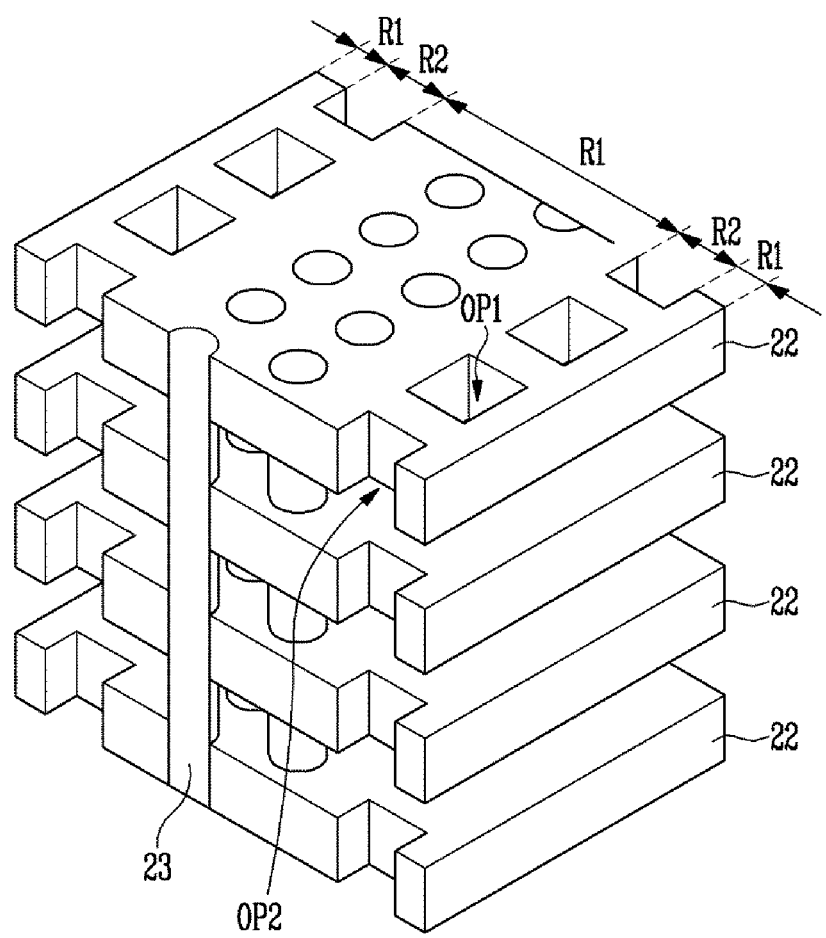

FIGS. 2, 3, 4A to 7A, and 4B to 7B are diagrams illustrating a representation of an example of a method of manufacturing a semiconductor device according to an embodiment. FIGS. 2 and 3 are perspective views, FIGS. 4A to 7A are layouts, and FIGS. 4B to 7B are cross-sectional views.

Referring to FIG. 2, sacrificial layers 21 and insulating layers 22 may be alternately formed. In an embodiment, sacrificial layers 21 may be a material including a high etch selectivity with respect to the insulating layers 22. For example, the sacrificial layers 21 may include a nitride or the like, and the insulating layers 22 may include an oxide or the like.

Next, semiconductor patterns 23 passing through the sacrificial layers 21 and the insulating layers 22 may be formed. For example, after forming holes passing through the sacrificial layers 21 and the insulating layers 22, the holes may be filled with the semiconductor patterns 23. For example, before forming the semiconductor patterns 23, memory layers (not illustrated) may be formed on inner walls of the holes. The memory layers may include at least one of charge-blocking layers, data storage layers, and tunnel layers. The data storage layers may include silicon, a nitride, nano-dots, a phase-changeable material, or the like. The semiconductor patterns 23 may be disposed to pass through first regions R1 of the insulating layers 22.

Next, island-type first openings OP1 passing through the sacrificial layers 21 and the insulating layers 22 may be formed. For example, the first openings OP1 may have a variety of cross-sectional shapes, such as a circular, oval, tetragonal, or polygonal shape. Second regions R2 of the insulating layers 22 may be isolated from each other by the first openings OP1, and have a bridge shape connecting the first regions R1 located at both ends of the second regions R2.

Referring to FIG. 3, second openings OP2 may be formed by removing the sacrificial layers 21 exposed by the first openings OP1. The semiconductor patterns 23 or the memory layers may be partially exposed through the second openings OP2.

Figure 4A:
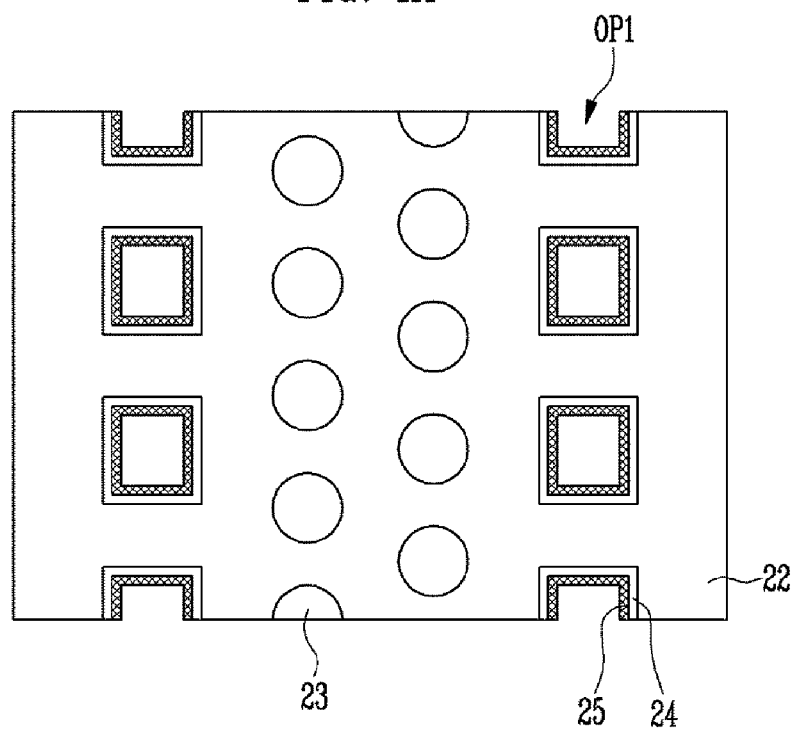
Figure 4B:
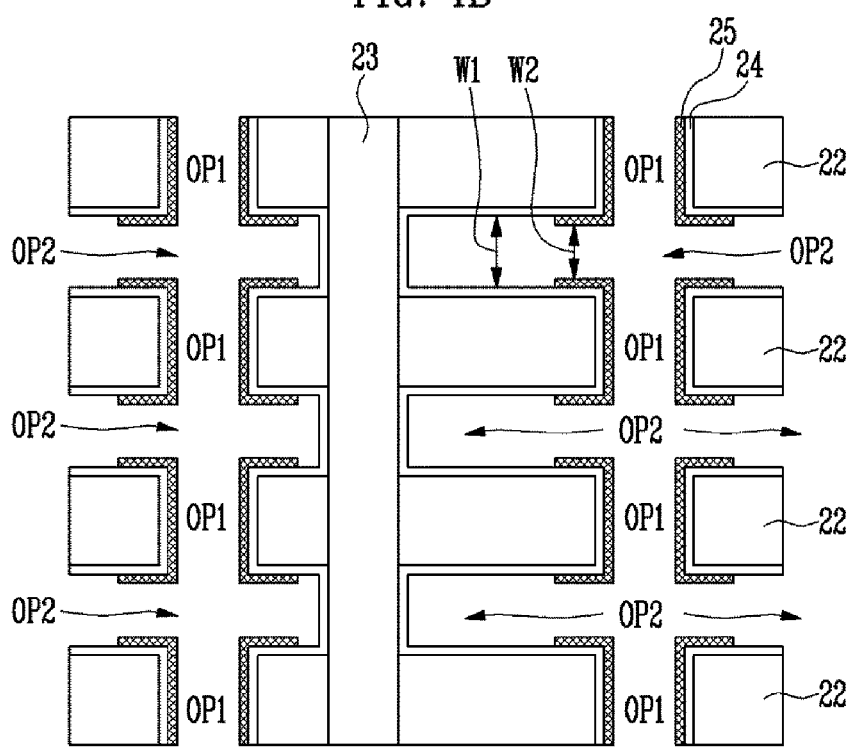

Referring to FIGS. 4A and 4B, barrier layers 24 may be formed along surfaces of the insulating layers 22 exposed by the first and second openings OP1 and OP2. The barrier layers 24 may be formed on surfaces of the semiconductor patterns 23 or memory layers exposed by the second openings OP2.

Next, deposition-preventing layers 25 are formed on surfaces of the barrier layers 24 exposed by the first openings OP1. In an embodiment, the deposition-preventing layers 25 may be formed using a method having low step-coverage. The deposition-preventing layers 25 may be mainly formed on vertical surfaces of the insulating layers 22, and partially formed on the second openings OP2. For example, the deposition-preventing layers 25 may be formed on portions of horizontal surfaces of the insulating layers 22 adjacent to the first openings OP1. The deposition-preventing layers 25 may not be formed at insides of the second openings OP2 adjacent to the semiconductor patterns 23. The insides of the second openings OP2 adjacent to the semiconductor patterns 23 have a first width W1. The deposition-preventing layers 25 may be formed at insides of the second openings OP2 adjacent to the first openings OP1. The insides of the second openings OP2 adjacent to the first openings OP1 may have a second width W2 less than the first width W1. For example, the deposition-preventing layers 25 may be formed using $N_2$ plasma, $NH_3$ plasma, Ar plasma, $O_2$ plasma, or hydrogen plasma and may include a nitride, an oxide, or a hydrogen-bonded material.

Figure 5A:
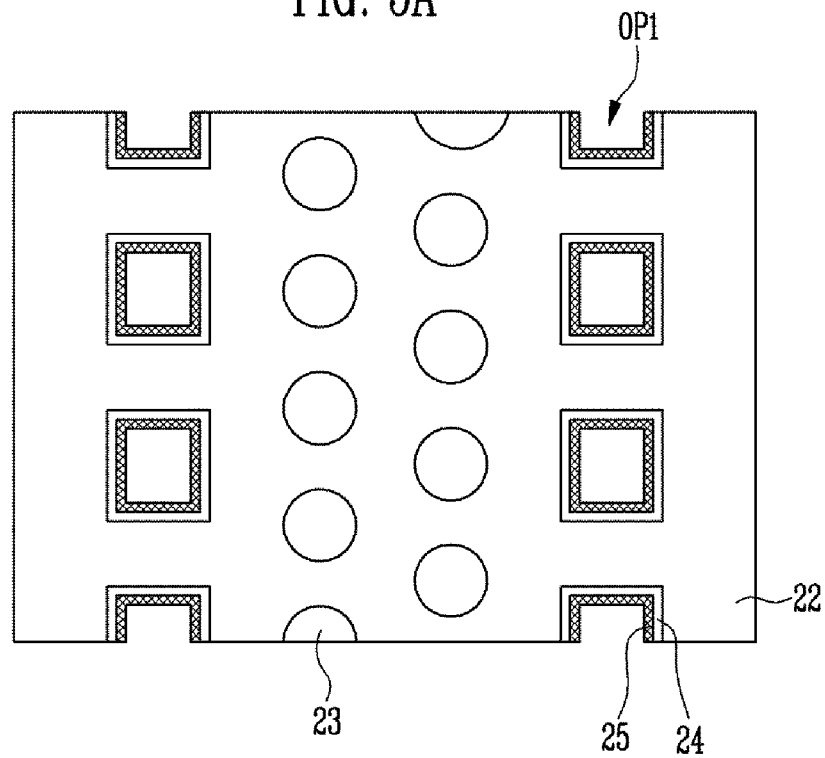
Figure 5B:
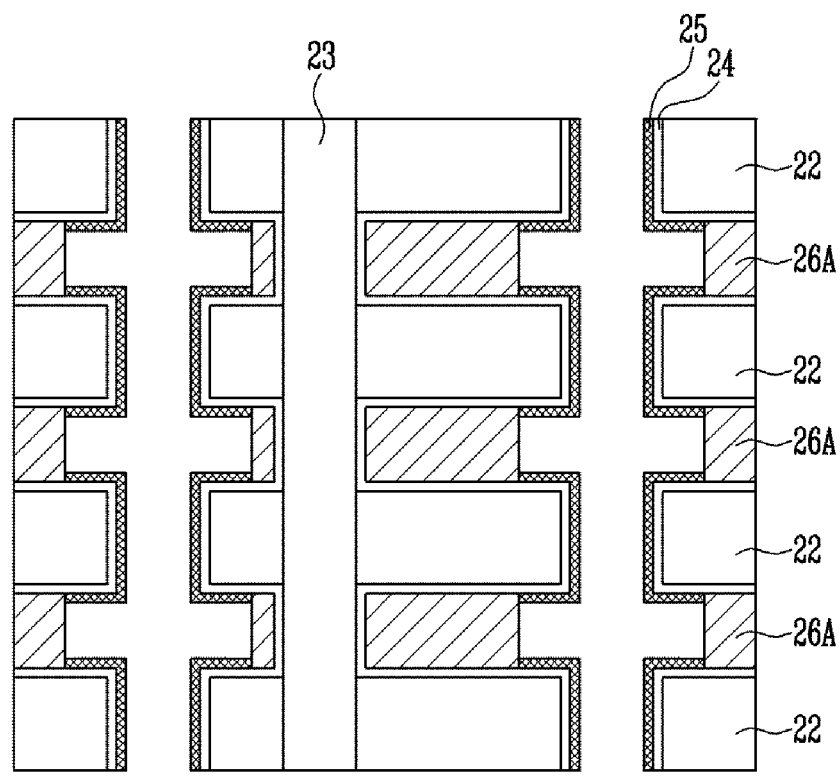

Referring to FIGS. 5A and 5B, metal layers 26A may be deposited on the barrier layers 24 exposed by the deposition-preventing layers 25. In an embodiment, due to characteristics of the metal layers 26A and the deposition-preventing layers 25, the metal layers 26A may be selectively deposited on the barrier layers 24 without being deposited on the deposition-preventing layers 25. This is due to a difference in bonding energies of the barrier layers 24 and the deposition-preventing layers 25. Since the deposition-preventing layers 25 has a greater bonding energy than the barrier layers 24, the metal layers 26A may be selectively deposited on the barrier layers 24. For example, since adhesive strengths between the deposition-preventing layers 25 and the metal layers 26A are less than adhesive strengths between the barrier layers 24 and the metal layers 26A, the metal layers 26A may be selectively deposited only on the barrier layers 24.

Figure 6A:
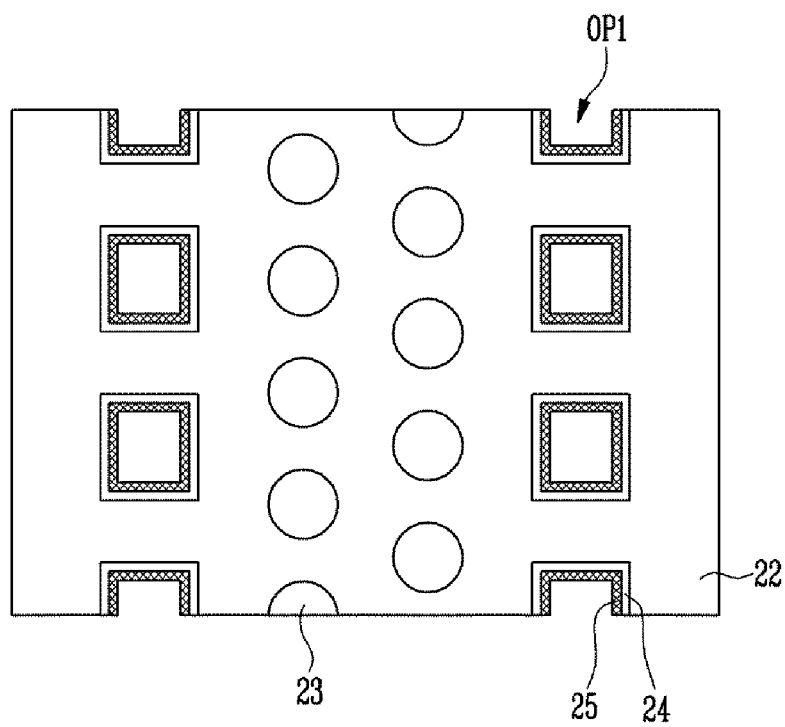
Figure 6B:
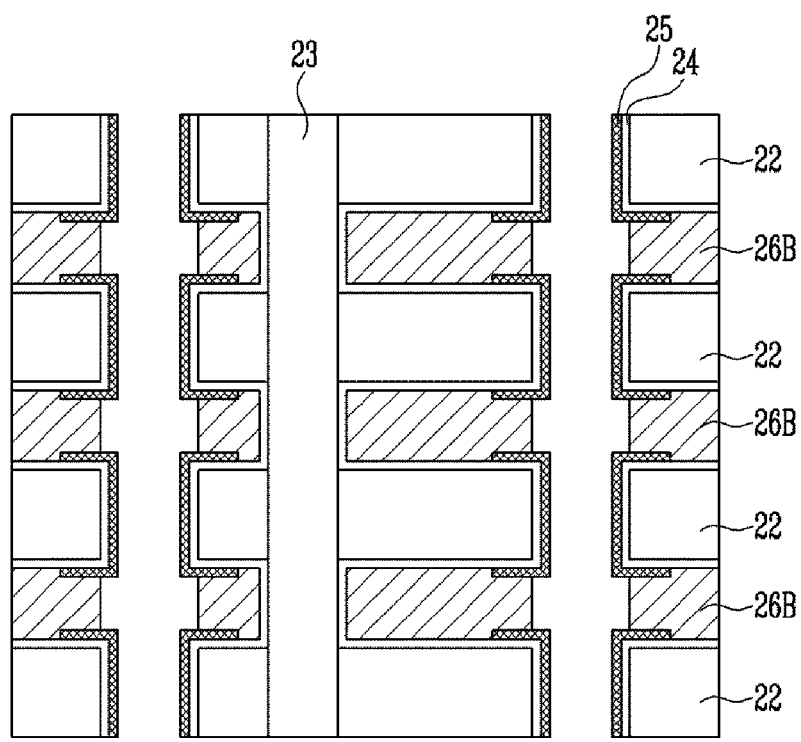

Referring to FIGS. 6A and 6B, metal layers 26B may be grown from the deposited metal layers 26A The metal layers 26B may be easily formed even in the second openings OP2 having a width narrowed by the deposition-preventing layers 25, and limitedly formed between the first regions R1 of the stacked insulating layers 22. The stacked metal layers 26B may be isolated from each other by controlling growth conditions, such as a gas flow rate, time, or the like.

Figure 7A:
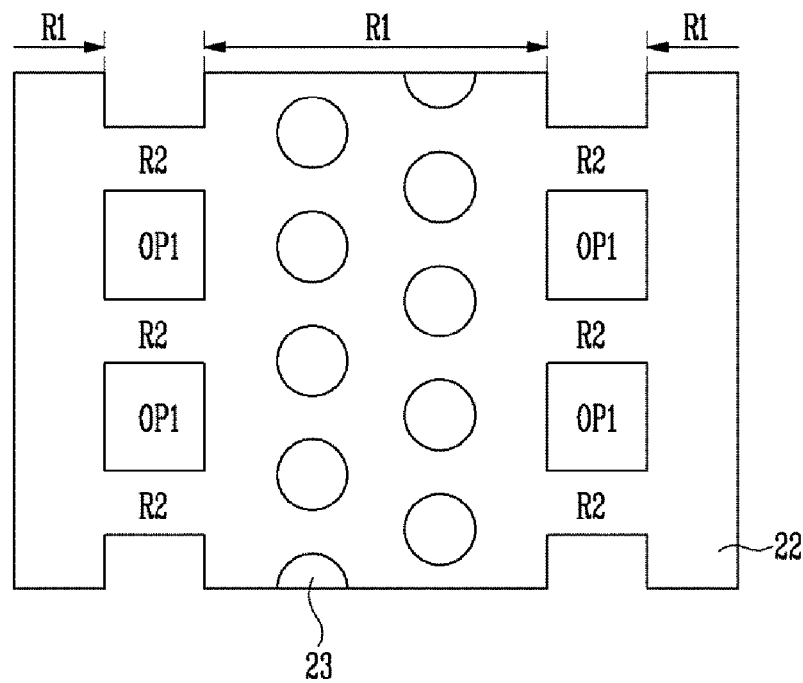
Figure 7B:
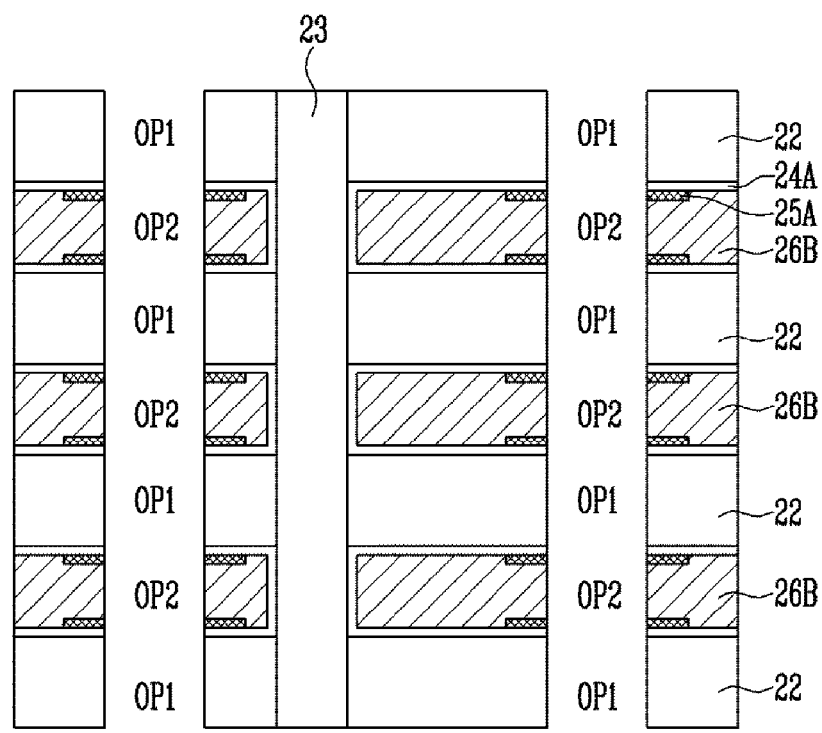

Referring to FIGS. 7A and 7B, the barrier layers 24 and the deposition-preventing layers 25 exposed in the first openings OP1 are removed. For example, barrier layers 24 and the deposition-preventing layers 25 formed on the insulating layers 22 exposed by the first openings OP1 are removed. The deposition-preventing layers 25 interposed between the barrier layers 24 and the metal layers 26B may remain without being removed. Accordingly, barrier patterns 24A and deposition-preventing patterns 25A may be formed. Thus, conductive layers including the metal layers 26B, the barrier patterns 24A, and the deposition-preventing patterns 25A may be formed.

For reference, the barrier layers 24 may be replaced by seed layers, and the deposition-preventing layers 25 may be replaced by growth-preventing layers. Here, the seed layers may have the same shape as the barrier layers 24, and the growth-preventing layers may have the same shape as the deposition-preventing layers 25. When the barrier layers 24 are replaced by the seed layers, metal layers 26A may be grown from the seed layers exposed by the growth-preventing layers. For example, since the seed layers serve as nucleation for growing the metal layers 26A such as W, the metal layers 26A may be selectively grown from the seed layers. In an embodiment, since portions of the seed layers covered by the growth-preventing layers are not in contact with a source gas, the metal layers 26A may not be grown. Accordingly, areas on which the metal layers 26A are grown may be controlled.

According to the processes described above, before the metal layers 26A are formed, dielectric patterns including a nitride, an oxide, or the like may be formed on the insulating layers 22 exposed by the first openings OP1. For example, since the dielectric patterns are used as the deposition-preventing layers or the growth-preventing layers, it may prevent deposition or growth of the metal layers 26A on the insulating layers 22 exposed by the first openings OP1. Accordingly, bridges between the conductive layers may be prevented from being generated.

Figure 8:
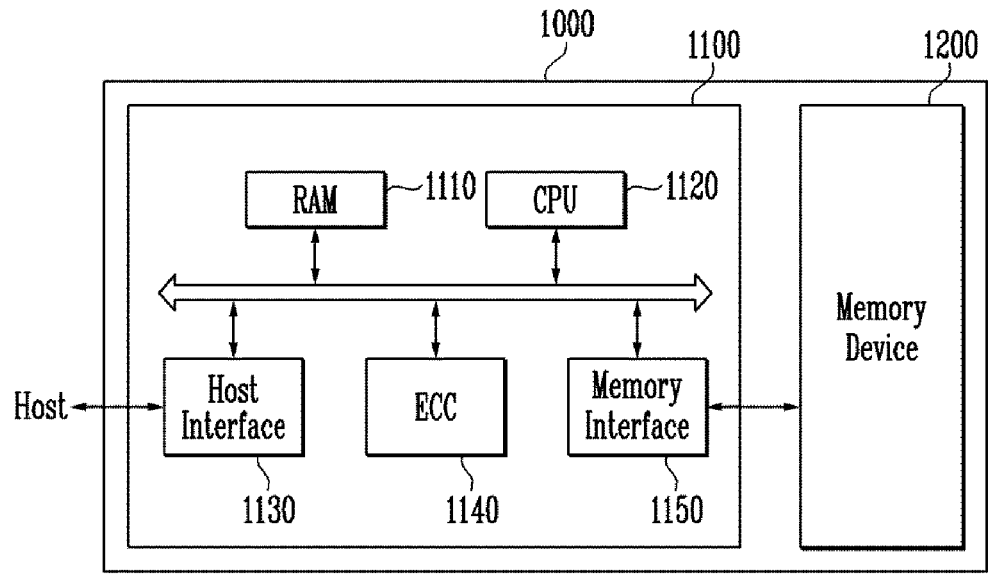
FIGS. 8 and 9 are block diagrams illustrating representations of examples of configurations of memory systems according to various embodiments.

FIG. 8 is a block diagram illustrating representations of examples of a configuration of a memory system according to an embodiment.

Referring to FIG. 8, a memory system 1000 according to an embodiment may include a memory device 1200 and a controller 1100.

The memory device 1200 may be used to store data information having various data forms, such as text, graphics, or software codes. The memory device 1200 may be a nonvolatile memory device, and include the structure described with reference to FIGS. 1A to 7B. The memory device 1200 may be configured to include semiconductor patterns. The memory device 1200 may include insulating layers including first regions surrounding the semiconductor patterns and second regions isolated from each other by island-type first openings and connecting adjacent first regions. The memory device 1200 may include metal layers interposed between the first regions of the stacked insulating layers surrounding the semiconductor patterns, and isolated from each other by line-type second openings overlapping the first openings and the second regions. The memory device 1200 may include dielectric patterns partially interposed between the insulating layers and the metal layers and exposed through the second openings. Since a structure of the memory device 1200 and a manufacturing method thereof are the same as those described above, detailed descriptions thereof will be omitted.

The controller 1100 may be connected to a host and the memory device 1200, and configured to access the memory device 1200 in response to the host. For example, the controller 1100 may be configured to control a read, write, erase, and background operation of the memory device 1200.

The controller 1100 may include a random access memory (RAM) 1110, a central processing unit (CPU) 1120, a host interface 1130, an error correction code (ECC) circuit 1140, and a memory interface 1150.

Here, the RAM 1110 may be an operation memory of the CPU 1120, a cache memory between the memory device 1200 and the host, and a buffer memory of the memory device 1200 and the host. For reference, the RAM 1110 may be replaced by a static random access memory (SRAM), a read only memory (ROM), etc.

The CPU 1120 may be configured to control overall operations of the controller 1100. For example, the CPU 1120 may be configured to operate firmware such as a flash translation layer (FTL) stored in the RAM 1110.

The host interface 1130 may be configured to perform interfacing with the host. For example, the controller 1100 may communicate with the host through at least one of various interface protocols, such as a Universal Serial Bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The ECC circuit 1140 may be configured to detect errors included in data read from the memory device 1200 by using an ECC and correct the errors.

The memory interface 1150 may be configured to perform interfacing with the memory device 1200. For example, the memory interface 1150 may include a NAND interface or a NOR interface.

For reference, the controller 1100 may further include a buffer memory (not illustrated) for temporarily storing data. Here, the buffer memory may be used to temporarily store data transmitted to the outside through the host interface 1130 or data transmitted from the memory device 1200 through the memory interface 1150. In addition, the controller 1100 may further include a ROM storing code data for interfacing with the host.

In this manner, since the memory system 1000 according to an embodiment may include the memory device 1200 having a stable structure and a high degree of integration, the degree of integration of the memory system 1000 may also be improved.

Figure 9:
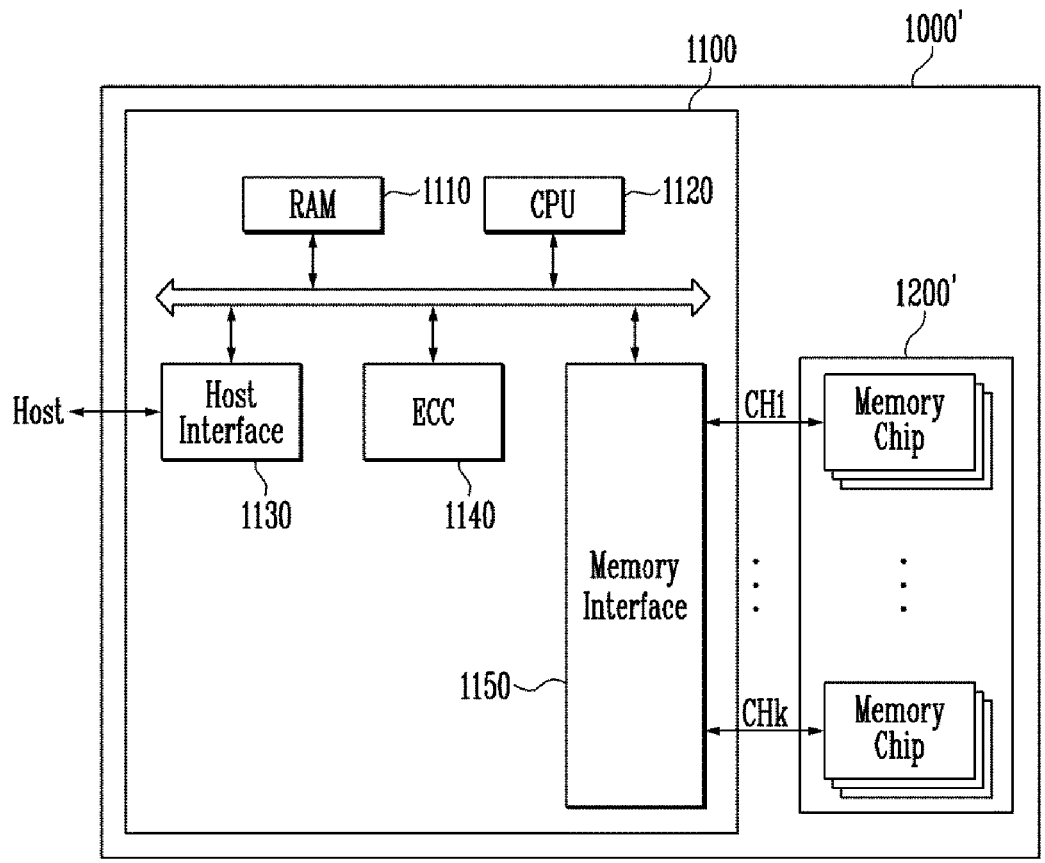

FIG. 9 is a block diagram illustrating representations of examples of a configuration of a memory system according to an embodiment. Hereinafter, repeated explanation of the above-described structure will be omitted.

As illustrated in FIG. 9, a memory system 1000' according to an embodiment may include a memory device 1200' and a controller 1100. In addition, the controller 1100 may include a RAM 1110, a CPU 1120, a host interface 1130, an ECC circuit 1140, and a memory interface 1150.

The memory device 1200' may be a nonvolatile memory device, and include a memory string described with reference to FIGS. 1A to 7B. In addition, the memory device 1200' may include semiconductor patterns. The memory device 1200' may include insulating layers including first regions surrounding the semiconductor patterns and second regions isolated from each other by island-type first openings and connecting adjacent first regions. The memory device 1200' may include metal layers interposed between the first regions of the stacked insulating layers surrounding the semiconductor patterns, and isolated from each other by line-type second openings overlapping the first openings and the second regions. The memory device 1200' may include dielectric patterns partially interposed between the insulating layers and the metal layers and exposed through the second openings. Since a structure and a manufacturing method of the memory device 1200' are the same as those described above, detailed descriptions will be omitted.

In addition, the memory device 1200' may be a multi-chip package consisting of a plurality of memory chips. The plurality of memory chips may be divided into a plurality of groups, the plurality of groups may be configured to communicate with the controller 1100 through first to $k^{th}$ channels CH1 to CHk. In addition, the memory chips belonging to a group may be configured to communicate with controller 1100 through a common channel. For reference, the memory system 1000' may be modified in such a manner that one memory chip is connected to one channel.

In this manner, since the memory system 1000' according to an embodiment may include the memory device 1200' having a stable structure and a high degree of integration, the degree of integration of the memory system 1000' may also be improved. In particular, since the memory device 1200' is formed as a multi-chip package, data storage capacity of the memory system 1000' may be increased, and an operating speed may be improved.

Figure 10:
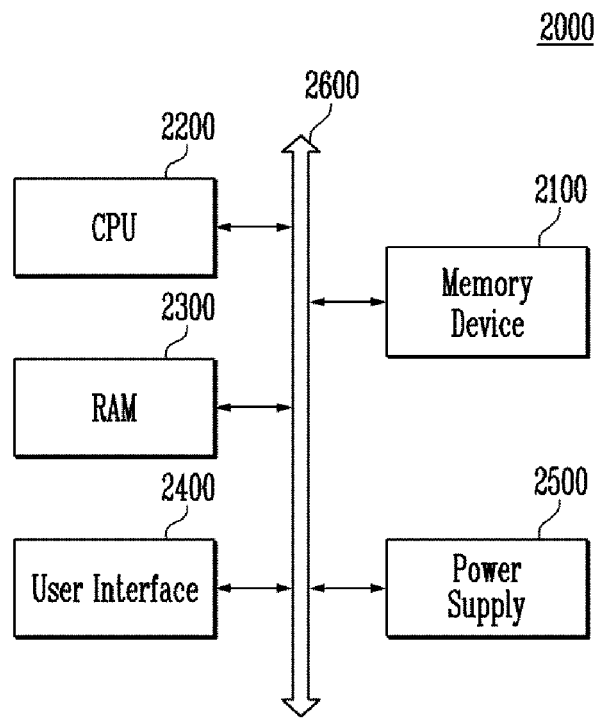
FIGS. 10 and 11 are block diagrams illustrating representations of examples of configurations of computing systems according to various embodiments.

FIG. 10 is a block diagram illustrating a configuration of a computing system according to an embodiment of the present invention. Hereinafter, repeated explanation of the above-described will be omitted.

As illustrated in FIG. 10, a computing system 2000 according to an embodiment may include a memory device 2100, a CPU 2200, a RAM 2300, a user interface 2400, a power supply 2500, and a system bus 2600.

The memory device 2100 may store data provided through the user interface 2400, data processed by the CPU 2200, etc. In addition, the memory device 2100 may be electrically coupled to the CPU 2200, the RAM 2300, the user interface 2400, and the power supply 2500 through the system bus 2600. For example, the memory device 2100 may be coupled to the system bus 2600 through a controller (not illustrated), or directly connected to the system bus 2600. When the memory device 2100 is directly connected to the system bus 2600, the CPU 2200, RAM 2300, etc. may function as the controller.

Here, the memory device 2100 may be a nonvolatile memory device, and may include the memory string described with reference to FIGS. 1A to 7B. The memory device 2100 may include semiconductor patterns. The memory device 2100 may include insulating layers including first regions surrounding the semiconductor patterns and second regions isolated from each other by island-type first openings and connecting adjacent first regions. The memory device 2100 may include metal layers interposed between the first regions of the stacked insulating layers surrounding the semiconductor patterns, and isolated from each other by line-type second openings overlapping the first openings and the second regions. The memory device 2100 may include dielectric patterns partially interposed between the insulating layers and the metal layers and exposed through the second openings. Since a structure and a manufacturing method of the memory device 2100 is the same as those described above, detailed descriptions will be omitted.

In addition, the memory device 2100 may be a multi-chip package consisting of a plurality of memory chips, as described with reference to FIG. 9.

The computing system 2000 having such a configuration may be a computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation apparatus, a black box, a digital camera, a three-dimensional television, a digital audio recorder, a digital audio player, a digital picture recorder, a digital picture player, a digital video recorder, a digital video player, a device transmitting and receiving information in a wireless environment, one of a variety of electronic devices configuring a home network, one of a variety of electronic devices configuring a computer network, one of a variety of electronic devices configuring a telematics network, an RFID device, etc.

In this manner, since the computing system 2000 according to an embodiment may include the memory device 2100 having a stable structure and a high degree of integration, a data storage capacity of the computing system 2000 may be increased.

Figure 11:
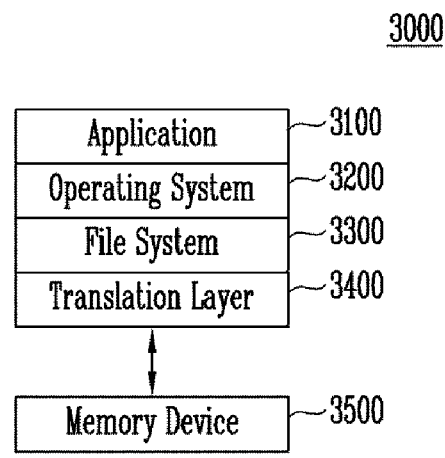

FIG. 11 is a block diagram illustrating representations of examples of a computing system according to an embodiment.

Referring to FIG. 11, a computing system 3000 according to an embodiment may include a software layer including an operating system 3200, an application 3100, a file system 3300, and a translation layer 3400. The computing system 3000 may include a hardware layer such as a memory device 3500.

The operating system 3200 may be configured to manage a software resource and a hardware resource of the computing system 3000, and control a program operation of a CPU. The application 3100 may be a variety of application programs executed in the computing system 3000, that is, a utility operated by the operating system 3200.

The file system 3300 may denote a logical structure for managing data and files existing in the computing system 3000, and organize data or files to be stored in the memory device 3500, etc. according to rules. The file system 3300 may be determined according to the operating system 3200 used in the computing system 3000. For example, when the operating system 3200 is a Windows product by Microsoft Corporation, the file system 3300 may be a file allocation table (FAT), an NT file system (NTFS), etc. In addition, when the operating system 3200 is a UNIX/Linux product, the file system 3300 may be an extended file system (EFS), a UNIX file system (UFS), or a journaled file system (JFS), etc.

Although the operating system 3200, the application 3100, and the file system 3300 are illustrated as separated blocks in FIG. 7, the application 3100 and the file system 3300 may be included in the operating system 3200.

The translation layer 3400 may translate an address to a form suitable for the memory device 3500 in response to a request from the file system 3300. For example, the translation layer 3400 translates a logic address generated by the file system 3300 to a physical address of the memory device 3500. Here, mapping information of the logic address and physical address may be stored in an address translation table. For example, the translation layer 3400 may be a flash translation layer (FTL), a universal flash storage link layer (ULL), etc.

The memory device 3500 may be a nonvolatile memory device, and may include the memory string described with reference to FIGS. 1A to 7B. The memory device 3500 may include semiconductor patterns. The memory device 3500 may include insulating layers including first regions surrounding the semiconductor patterns and second regions isolated from each other by island-type first openings and connecting adjacent first regions. The memory device 3500 may include metal layers interposed between the first regions of the stacked insulating layers surrounding the semiconductor patterns, and isolated from each other by line-type second openings overlapping the first openings and the second regions. The memory device 3500 may include dielectric patterns partially interposed between the insulating layers and the metal layers and exposed through the second openings. Since a structure and a manufacturing method of the memory device 3500 is the same as those described above, detailed descriptions will be omitted.

The computing system 3000 having such a structure may be divided into an operating system layer performed at a high level region, and a controller layer performed at a low level region. For example, the application 3100, the operating system 3200, and the file system 3300 may belong to the operating system layer and may be driven by an operational memory of the computing system 3000. In addition, the translation layer 3400 may belong to the operating system layer or the controller layer.

In this manner, since the computing system 3000 according to an embodiment may include the memory device 3500 having a stable structure and a high degree of integration, a data storage capacity of the computing system 3000 may be increased.

According to the embodiments, a location of a conductive layer may be controlled using a dielectric pattern. Accordingly, a memory device having a low level of difficulty in a manufacturing process, a stable structure, and improved characteristics may be implemented.

In the drawings and specification, there have been disclosed various examples of embodiments and, although specific terms are employed, they are used in a generic and descriptive sense only and not for purposes of limitation. Therefore, it will be understood by those of ordinary skill in the art that various changes in form and details may be made therein without departing from the spirit and scope of the disclosure.

What is claimed is:

1. A semiconductor device, comprising:
semiconductor patterns;
insulating layers including first regions surrounding the semiconductor patterns, and second regions isolated from each other by island-type first openings and connecting the first regions adjacent to each other;
metal layers interposed between the first regions of the stacked insulating layers surrounding the semiconductor patterns, and isolated from each other by line-type second openings overlapping the first openings and the second regions; and
dielectric patterns partially interposed between the insulating layers and the metal layers and exposed through the second openings,
wherein the metal layers are coupled to the dielectric patterns only in a region adjacent to the second openings, and are not coupled to the dielectric patterns in a region other than the region adjacent to the second openings.

2. The semiconductor device of claim 1, further comprising barrier patterns interposed between the semiconductor patterns and the metal layers, between the metal layers and the insulating layers, and between the dielectric patterns and the insulating layers.

3. The semiconductor device of claim 2, wherein adhesive strengths between the barrier patterns and the metal layers are greater than adhesive strengths between the dielectric patterns and the metal layers.

4. The semiconductor device of claim 2, wherein the barrier patterns have a "C" shape surrounding the metal layers.

5. The semiconductor device of claim 2, wherein the barrier patterns include tantalum (Ta), titanium (Ti), tantalum nitride (TaN), or titanium nitride (TiN).

6. The semiconductor device of claim 1, wherein the dielectric patterns include a nitride, an oxide, or a hydrogen-bonded material.

7. The semiconductor device of claim 1, wherein the metal layers have a smaller width at an area adjacent to the second openings than at an area adjacent to the semiconductor patterns.

8. The semiconductor device of claim 1, wherein the insulating layers include an oxide or a nitride.

9. The semiconductor device of claim 1, further comprising seed patterns interposed between the semiconductor patterns and the metal layers, between the metal layers and the insulating layers, and between the dielectric patterns and the insulating layers.

* * * * *